United States Patent
Li et al.

(10) Patent No.: US 8,324,700 B2
(45) Date of Patent: Dec. 4, 2012

(54) IMAGE SENSOR DEVICE AND METHOD FOR MAKING SAME

(75) Inventors: Jui-Kang Li, HsinChu (TW); Yi-Fong Tseng, HsinChu (TW); Chien-Hsien Tseng, HsinChu (TW)

(73) Assignee: Pixart Imaging Incorporation, Hsin-Chu (TW)

( * ) Notice: Subject to any disclaimer, the term of this patent is extended or adjusted under 35 U.S.C. 154(b) by 252 days.

(21) Appl. No.: 12/818,378

(22) Filed: Jun. 18, 2010

(65) Prior Publication Data

US 2011/0001206 A1 Jan. 6, 2011

Related U.S. Application Data

(60) Provisional application No. 61/223,363, filed on Jul. 6, 2009.

(51) Int. Cl.
*H01L 31/0232* (2006.01)
(52) U.S. Cl. .................. 257/432; 257/E31.127
(58) Field of Classification Search ........... 257/E31.127, 257/432
See application file for complete search history.

(56) References Cited

U.S. PATENT DOCUMENTS

| | | | |
|---|---|---|---|
| 6,792,804 B2 | 9/2004 | Adams et al. | |
| 6,861,686 B2 | 3/2005 | Lee et al. | |
| 7,193,289 B2 | 3/2007 | Adkisson et al. | |
| 7,205,623 B2 | 4/2007 | Hong et al. | |
| 7,400,003 B2 | 7/2008 | Lee et al. | |
| 7,462,507 B2 | 12/2008 | Lee et al. | |
| 7,822,300 B2 * | 10/2010 | Lee ................................ | 385/14 |
| 2007/0262366 A1 | 11/2007 | Baek | |
| 2008/0042177 A1 | 2/2008 | Park | |

FOREIGN PATENT DOCUMENTS

CN 101165878 A 4/2008
WO WO 02/103441 A1 12/2002
* cited by examiner

*Primary Examiner* — Matthew Landau
*Assistant Examiner* — Vicki B Booker
(74) *Attorney, Agent, or Firm* — Tung & Associates

(57) ABSTRACT

The present invention discloses an image sensor device and a method for making an image sensor device. The image sensor device comprises an optical pixel and an electronic circuit, wherein the optical pixel includes: a substrate; an image sensor area formed in the substrate; a masking layer formed above the image sensor area, wherein the masking layer is formed during a process for forming the electronic circuit; and a light passage above the masking layer for increasing light sensing ability of the image sensor area.

8 Claims, 6 Drawing Sheets

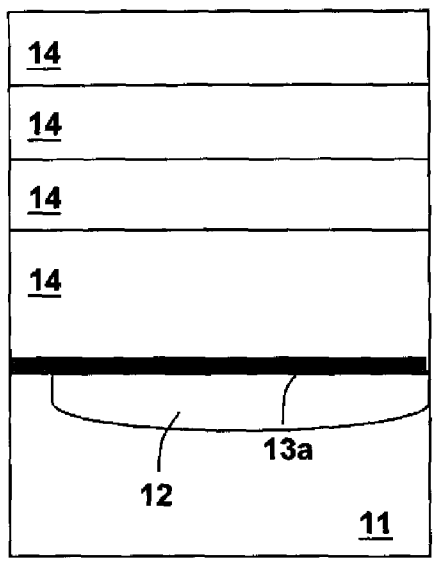
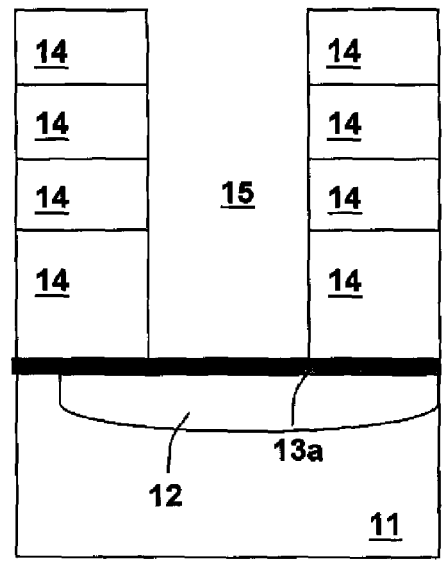
Fig. 3A            Fig. 3B
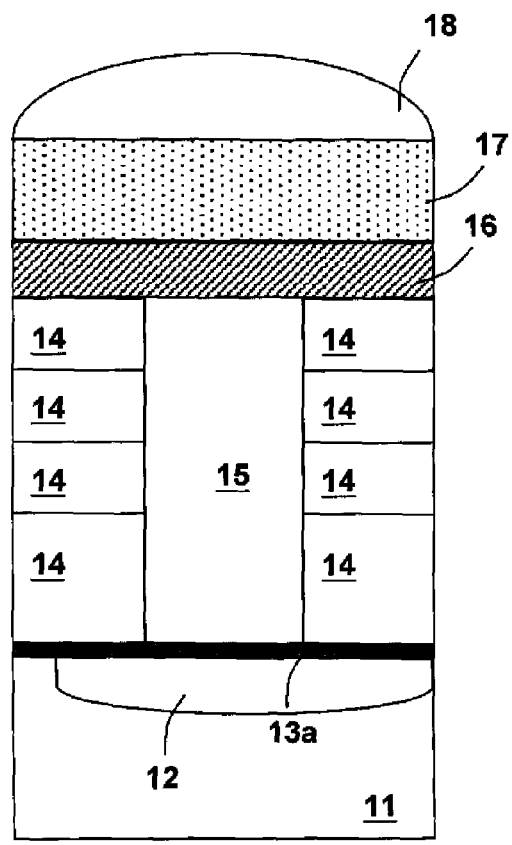
Fig. 3C

IMAGE SENSOR DEVICE AND METHOD FOR MAKING SAME

CROSS REFERENCE

The present invention claims priority to U.S. provisional application No. 61/223,363, filed on Jul. 6, 2009.

BACKGROUND OF THE INVENTION

1. Field of Invention

The present invention relates to an image sensor device and a method for making the image sensor device.

2. Description of Related Art

As shown in FIG. 1, typically, an image sensor device includes optical pixels 100 and an electronic circuit 200, wherein the electronic circuit 200 is made by a CMOS process in most nowadays applications. FIGS. 2A-2D show, by way of cross section diagrams, the steps for making a pixel:

Referring to FIG. 2A, an image sensor area 12 is formed in a substrate 11; and an oxide layer 13a, a polysilicon layer 13b, and multiple dielectric layers 14 are formed thereabove respectively. To match with the CMOS process, the oxide layer 13a and the polysilicon layer 13b are preferably made of materials the same as the gate dielectric layer and the gate conductive layer for making the electronic circuit.

Referring to FIG. 2B, with the polysilicon layer 13b serving as an etch stop layer, an etch process is taken to etch the dielectric layers 14, forming a light passage 15 above the image sensor area 12. The light passage 15 helps to let more light pass through and reach the image sensor area 12.

Referring to FIG. 2C, because the polysilicon layer 13b is non-transparent, to increase the light sensitivity of the image sensor area 12, the polysilicon layer 13b is removed. However, this etching process may damage the surface of the image sensor area 12, degrading the image sensing capability and accuracy of the device.

Referring to FIG. 2D, after the polysilicon layer 13b is removed, a passivation layer 16 is provided to cover an upper part of the topmost dielectric layer 14; next, a color filter layer 17 is formed above the passivation layer 16, and thereafter a micro-lens layer 18 is formed above the color filter layer 17.

With respect to the light passage and the CMOS image sensor, U.S. Pat. Nos. 6,861,686; 6,792,804; 7,205,623; 7,400,003; 7,462,507; 7,193,289; and U.S. publication No. 2007/0262366 disclose relevant technical details.

In FIGS. 2A-2D and the foregoing prior art citations, there is a drawback that multiple etching processes damage the surface of the image sensor area 12, degrading the image sensing capability and accuracy of the device.

SUMMARY OF THE INVENTION

A first objective of the present invention is to provide an image sensor device wherein the surface of an image sensor area is protected so as to increase the image sensing capability of the device.

Another objective of the present invention is to provide a method for making the image sensor device.

In order to achieve the foregoing objectives, in one perspective of the present invention, it provides an image sensor device comprising an optical pixel and an electronic circuit, wherein the optical pixel comprises: a substrate; an image sensor area formed in the substrate; a masking layer formed above the image sensor area, wherein the masking layer is formed during a process for forming the electronic circuit; and a light passage above the masking layer for increasing light sensing ability of the image sensor area.

The foregoing image sensor device may further comprise: a passivation layer on the light passage; a color filter layer on the passivation layer; and a micro lens layer on the color filter.

In another perspective of the present invention, it provides a method for making an image sensor device, comprising: providing a substrate; forming an image sensor area in the substrate; forming a masking layer above the image sensor area; depositing a dielectric layer above the masking layer; etching the dielectric layer until the masking layer, such that a light passage is formed above the masking layer; and retaining at least a part of the masking layer without removing it.

In the foregoing image sensor device and the method for making it, the image sensor area can be a photo diode, or a photo gate.

In the foregoing image sensor device and the method for making it, the masking layer can be made of at least one of the following materials: oxide, nitride, oxynitride, carbide, silicate, aluminate, polysilicon, and metal.

In the foregoing image sensor device and the method for making it, a middle layer can be provided between the image sensor area and the masking layer, wherein the middle layer can be made of at least one of the following materials: oxide, nitride, oxynitride, carbide, silicate, and aluminate.

In the foregoing image sensor device and the method for making it, the image sensor device can further comprise an optical resonator in the light passage above the masking layer, wherein the optical resonator for example can be a Fabry-Perot resonator.

In one embodiment of the present invention, the optical resonator includes an upper reflective layer and a lower reflective layer, wherein the lower reflective layer is formed by the masking layer, and the upper reflective layer is a metal-containing layer.

In one embodiment of the present invention, the optical resonator includes: a first metal-containing layer above the masking layer; a first non-metal-containing layer above the first metal-containing layer; a second metal-containing layer above the first non-metal-containing layer; and a second non-metal-containing layer above the second metal-containing layer. In one embodiment, the optical resonator may further include a third non-metal-containing layer between the masking layer and the first metal-containing layer.

In the foregoing embodiments, each metal-containing layer can be made of at least one of the following materials: gold, silver, titanium, tantalum, copper, aluminum, gold carbide, silver carbide, titanium carbide, tantalum carbide, copper carbide, aluminum carbide, gold oxide, silver oxide, titanium oxide, tantalum oxide, copper oxide, aluminum oxide, gold nitride, silver nitride, titanium nitride, tantalum nitride, copper nitride, and aluminum nitride.

In the foregoing embodiments, each non-metal-containing layer can be made of at least one of the following materials: oxide, nitride, oxynitride, and carbide.

The objectives, technical details, features, and effects of the present invention will be better understood with regard to the detailed description of the embodiments below, with reference to the drawings.

BRIEF DESCRIPTION OF THE DRAWINGS

FIGS. 3A-3C show the first embodiment of the present invention.

DESCRIPTION OF THE PREFERRED EMBODIMENTS

Figure 1:
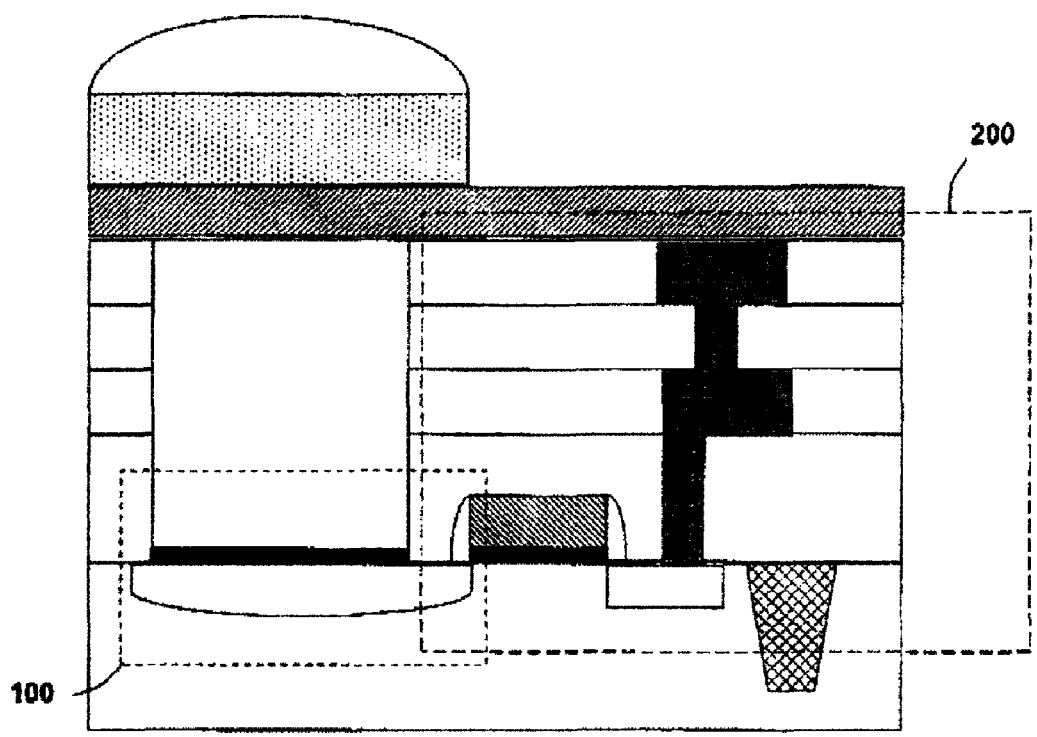
FIG. 1 and FIGS. 2A-2D show the cross section diagrams of a prior art image sensor device and its manufacturing process.
Figure 2A:
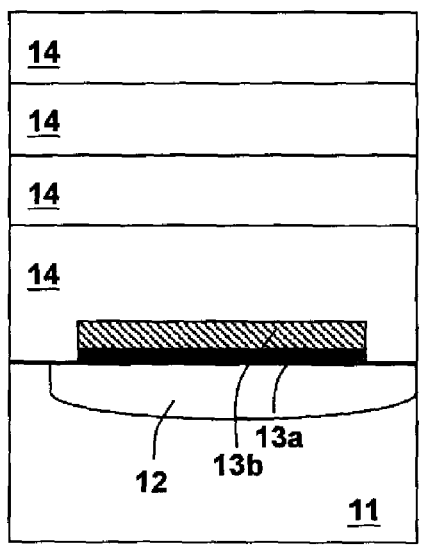
Figure 2B:
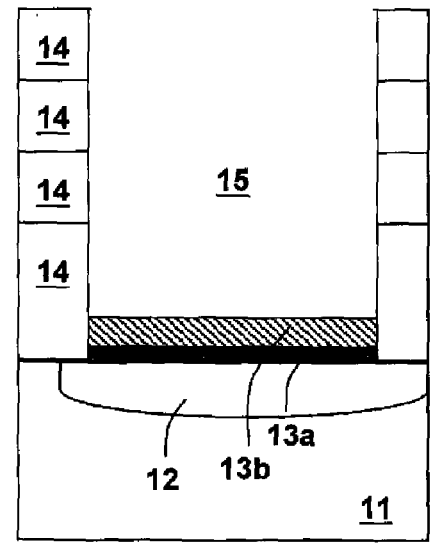
Figure 2C:
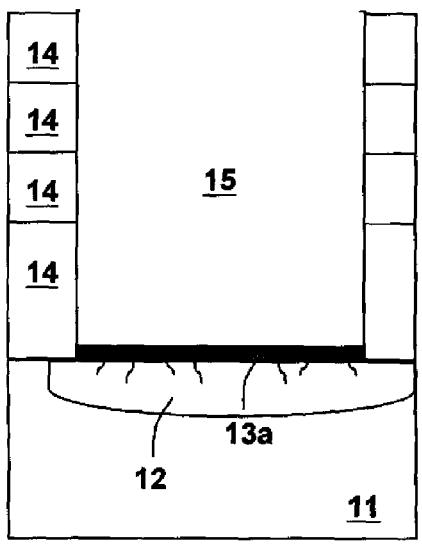
Figure 2D:
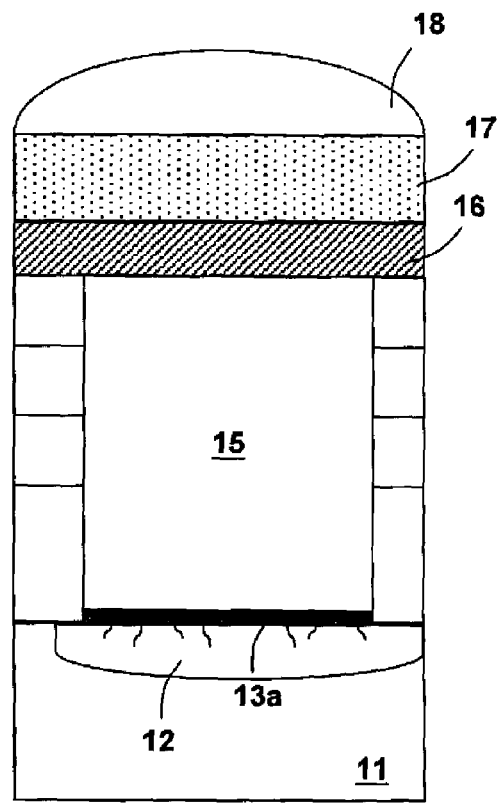

The drawings as referred to throughout the description of the present invention are for illustration only, to show the interrelationships between the process steps and between the layers, but not drawn according to actual scale.

The present invention has a feature that a masking layer is formed on a surface of an image sensor area, but the masking layer is not totally removed and remains in the image sensor device; thereby, it saves an etching step and prevents the surface of the image sensor device from being damaged by multiple etchings. The masking layer is preferably a layer required in a process for forming an electronic circuit, such as a gate dielectric layer, gate conductive layer, dielectric layer, metal-containing layer, sacrificial layer, or etch stop layer. In short, it is preferred that no additional deposition or etching step is required for forming the masking layer.

The present invention has another feature that an optical resonator for filtering light with a specific frequency is formed above the image sensor area; the optical resonator is, e.g., a Fabry-Perot resonator. The Fabry-Perot resonator may use the above-mentioned masking layer as a lower reflective layer, or use an additional layer formed above the masking layer as the lower reflective layer, and another layer as an upper reflective layer.

The following description will describe several embodiments in order to better illustrate the structure and processes of the present invention. Those skilled in this art can readily conceive variations and modifications based on such disclosure.

Please refer to FIGS. 3A-3C, which show the first embodiment of the present invention. In this embodiment, a gate dielectric layer 13a of the electronic circuit is used as the masking layer of an optical pixel. As shown in FIG. 3A, a substrate 11 is provided for forming an image sensor area 12 and an electronic circuit (e.g., a CMOS device) therein/thereon. The image sensor area 12 is formed in the substrate 11, and the gate dielectric layer 13a and multiple dielectric layers 14 are formed above the image sensor area 12, wherein the dielectric layers 14 for example can be made of silicon dioxide ($SiO_2$) or a material with low dielectric constant. The gate dielectric layer 13a can be a material with high dielectric constant, such as oxide (e.g., $Al_2O_3$, $HfO_2$, $ZrO_2$, $La_2O_3$, $Ta_2O_5$, $TiO_2$, or $CeO_2$), nitride (e.g., $Si_3N_4$), oxynitride (e.g., $SiO_xN_y$), carbide (e.g., SiC), silicate (e.g., $ZrSi_xO_y$, $HfSi_xO_y$, $AlSi_xO_y$), aluminate (e.g., $ZrAl_xO_y$, $HfAl_xO_y$), or a composite layer of the foregoing materials. Compared with $SiO_2$ or a material with low dielectric constant, the material with high dielectric constant has higher etching selectivity. Hence, as shown in FIG. 3B, the gate dielectric layer 13a can be used as an etch stop layer during a process for etching the dielectric layers 14, and a light passage 15 is formed above the image sensor area 12 such that light can sufficiently transmit through the light passage 15 to reach the image sensor area 12, and the image sensor area 12 can receive more light thereby. The dielectric layers 14 can be etched by time-mode control, so that the etch stops at the upper surface of the gate dielectric layer 13a to avoid damages to the image sensor area 12. Next, referring to FIG. 3C, a passivation layer 16, a color filter layer 17, and a micro lens layer 18 are deposited and formed. As such, the image sensor device is completed.

Figure 4A:
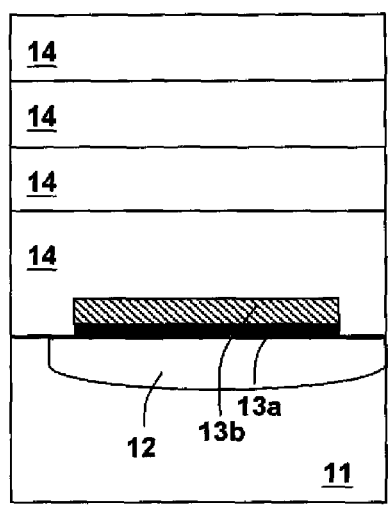
FIGS. 4A-4D show the second embodiment of the present invention.
Figure 4B:
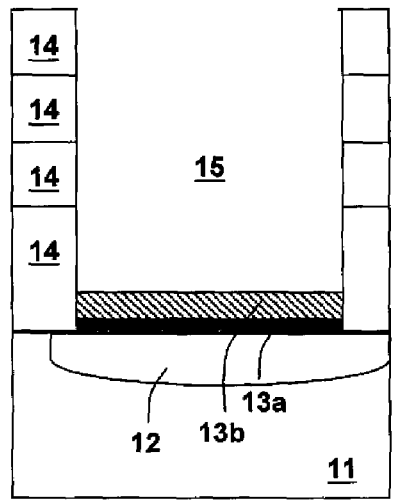
Figure 4C:
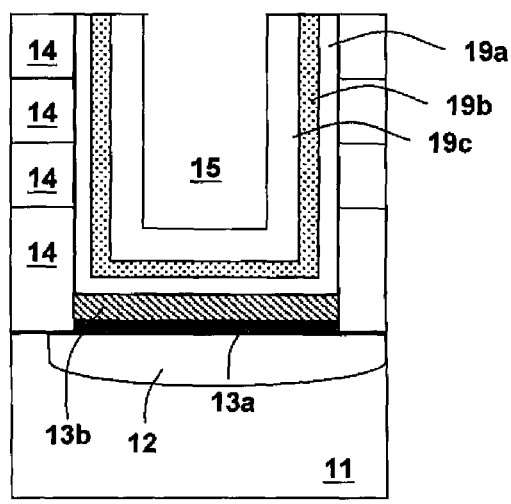
Figure 4D:
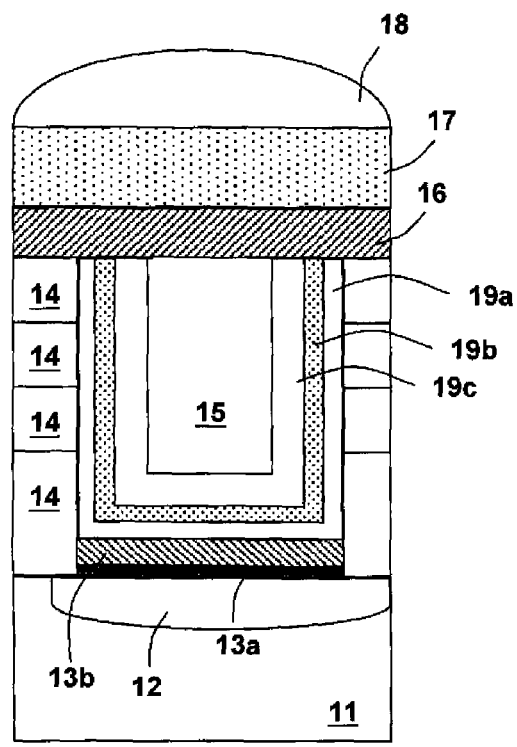

FIGS. 4A-4D show the second embodiment of the present invention, wherein a gate conductive layer 13b is used as the masking layer instead. As shown in FIG. 4A, a substrate 11 is provided for forming an image sensor area 12 and an electronic circuit (e.g., a CMOS device) therein/thereon. The image sensor area 12 is formed in the substrate 11. To match with the process for forming the electronic circuit, a gate dielectric layer 13a, a gate conductive layer 13b, and multiple dielectric layers 14 are formed above the image sensor area 12. The gate dielectric layer 13a can be made of silicon oxide or the above-mentioned material with high dielectric constant. As shown in FIG. 4B, the gate dielectric layer 13b serves as an etch stop layer during a process for etching the dielectric layers 14, and a light passage 15 is formed above the image sensor area 12 such that light can sufficiently transmit through the light passage 15 to reach the image sensor area 12, and the image sensor area 12 can receive more light thereby. Next, as shown in FIG. 4C, the gate conductive layer 13b is not removed, and a first light-transmissible layer 19a and a reflective layer 19b are sequentially deposited, wherein the light-transmissible layer 19a for example can be made of a non-metal material, and the reflective layer 19b can be made of a metal material. In addition, to protect the reflective layer 19b, a second light-transmissible layer 19c is preferably deposited on the reflective layer 19b, wherein the second light-transmissible layer 19c can be made of a non-metal material. Thus, a Fabry-Perot resonator, a type of optical resonator, is formed by the gate conductive layer 13b and the reflective layer 19b, wherein a resonation cavity is formed therebetween and only light with specific frequency can transmit therethrough. In this embodiment, the reflective layer 19b for example can be made of at least one of the following materials: gold, silver, titanium, tantalum, copper, aluminum, gold carbide, silver carbide, titanium carbide, tantalum carbide, copper carbide, aluminum carbide, gold oxide, silver oxide, titanium oxide, tantalum oxide, copper oxide, aluminum oxide, gold nitride, silver nitride, titanium nitride, tantalum nitride, copper nitride, and aluminum nitride. The first light-transmissible layer 19a and the second light-transmissible layer 19c can be made of at least one of the following materials: $SiO_2$, $SiO_xN_y$, SiC, and $Si_3N_4$. As shown in FIG. 4D, a passivation layer 16, a color filter layer 17, and a micro lens layer 18 are subsequently deposited on the optical resonator. As such, the image sensor device is completed.

Figure 5A:
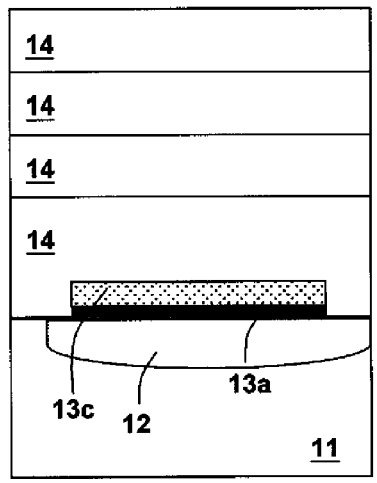
FIGS. 5A-5D show the third embodiment of the present invention.
Figure 5B:
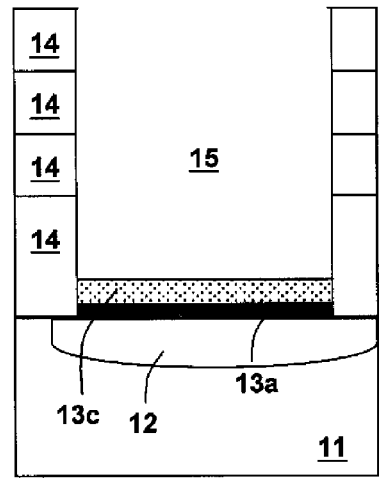
Figure 5C:
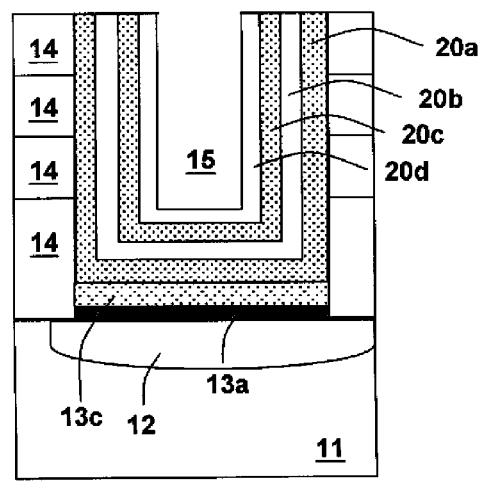
Figure 5D:
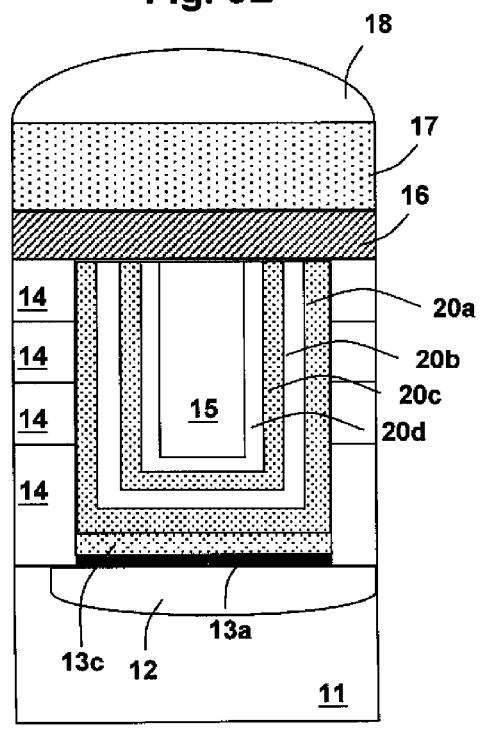
Figure 6A:
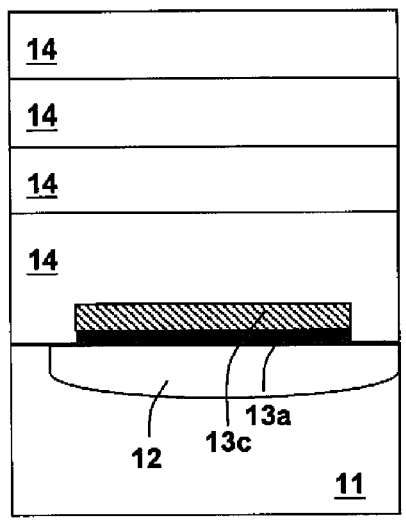
FIGS. 6A-6D show the fourth embodiment of the present invention.
Figure 6B:
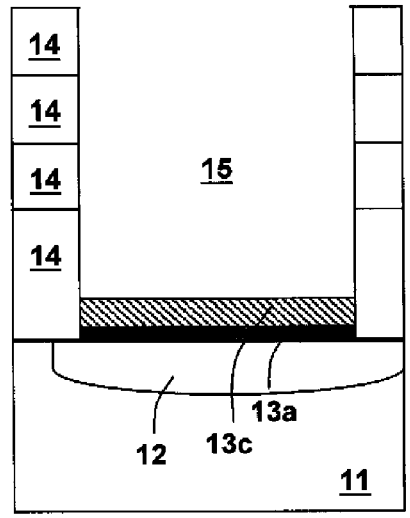
Figure 6C:
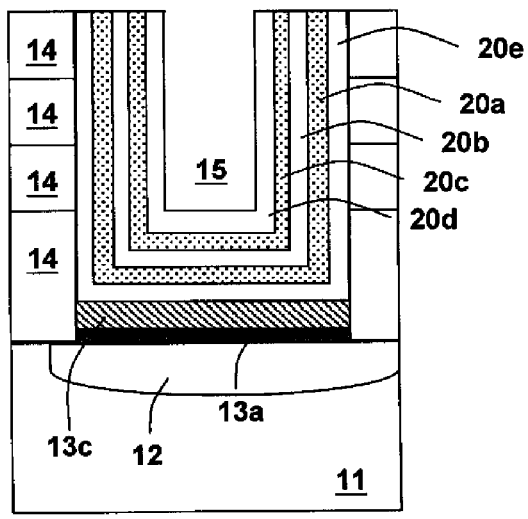
Figure 6D:
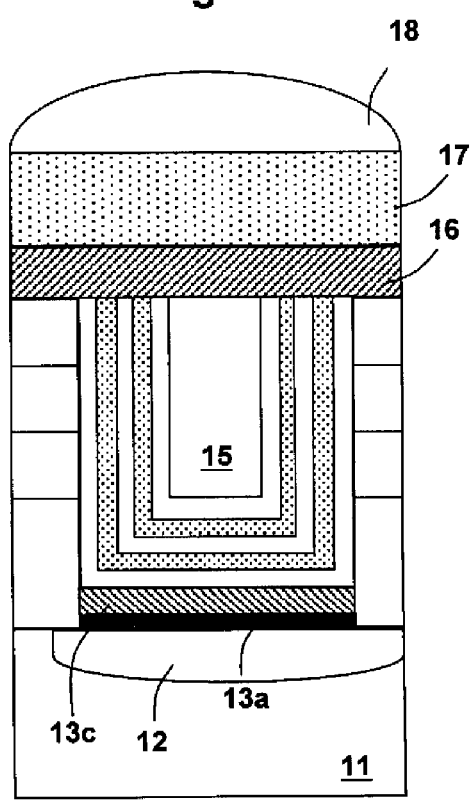

FIGS. 5A-5D show the third embodiment of the present invention, wherein an optical resonator is additionally formed above the masking layer. As shown in FIG. 5A, a substrate 11 is provided for forming an image sensor area 12 and an electronic circuit (e.g., a CMOS device) therein/thereon. The image sensor area 12 is formed in the substrate 11; a gate dielectric layer 13a, a masking layer 13c, and multiple dielectric layers 14 are formed above the image sensor area 12. The gate dielectric layer 13a can be made of silicon oxide or the above-mentioned material with high dielectric constant; the masking layer 13c can be made of a material the same as that of the gate conductive layer. Or, the gate dielectric layer 13a can be made of silicon oxide, and the masking layer 13c can be made of the above-mentioned material with high dielectric constant. In the former case, the masking layer 13c and a lower metal-containing layer of the optical resonator form a composite reflective layer; in the latter case, the masking layer 13c and the gate dielectric layer 13a form a composite light-transmissible layer. Next, referring to FIG. 5B, the dielectric layers 14 are etched and a light passage 15 is formed above the image sensor area 12, such that light can sufficiently transmit through the light passage 15 to reach the image sensor area 12, and the image sensor area 12 can receive more light thereby. Next, as shown in FIG. 5C, the masking layer 13c is not removed, and a first metal-containing layer 20a, a first non-metal-containing layer 20b, a second metal-containing layer 20c, and a second non-metal-containing layer 20d are sequentially deposited in the light passage 15. An optical resonator, e.g., a Fabry-Perot resonator, for filtering light with a specific frequency is thus formed. In this embodiment, the first metal-containing layer 20a and the second metal-containing layer 20c for example can be made of at least one of the following materials: gold, silver, titanium, tantalum, copper, aluminum, gold carbide, silver carbide, titanium carbide, tantalum carbide, copper carbide, aluminum carbide, gold oxide, silver oxide, titanium oxide, tantalum oxide, copper oxide, aluminum oxide, gold nitride, silver nitride, titanium nitride, tantalum nitride, copper nitride, and aluminum nitride. The first non-metal-containing layer 20b and the second non-metal-containing layer 20d for example can be made of at least one of the following materials: $SiO_2$, $SiO_xN_y$, SiC, $Si_3N_4$, and the like. As shown in FIG. 5D, a passivation layer 16, a color filter layer 17, and a micro lens layer 18 are subsequently deposited on the optical resonator. As such, the image sensor device is completed.

FIGS. 6A-6D show the fourth embodiment of the present invention. The structure and process of this embodiment are similar to the third embodiment. The only difference is that an additional third non-metal-containing layer 20e is provided between the masking layer 13c and the first metal-containing layer 20a. The third non-metal-containing layer 20e for example can be made of at least one of the following materials: $SiO_2$, $SiO_xN_y$, SiC, $Si_3N_4$, and the like.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. As an example, the materials and number of layers shown in each embodiment are for illustration only and can be modified in many ways. As another example, the electronic circuit integrated with the optical pixel is not limited to a CMOS device and can be any other circuit or device such as a BJT or the like. As yet another example, the masking layer can be a material layer other than the gate dielectric layer or the gate conductive layer, such as a sacrificial layer formed before the gate structure is completed, or barrier layer. As still another example, the masking layer is not limited to one single layer and can be a composite layer. In view of the foregoing, the spirit of the present invention should cover all such and other modifications and variations, which should be interpreted to fall within the scope of the following claims and their equivalents.

What is claimed is:

1. An image sensor device comprising an optical pixel and an electronic circuit, wherein the optical pixel comprises:
a substrate;
an image sensor area formed in the substrate;
a masking layer formed above the image sensor area, wherein the masking layer is formed during a process for forming the electronic circuit;
a light passage above the masking layer for increasing light sensing ability of the image sensor area; and
an optical resonator in the light passage above the masking layer, wherein the optical resonator includes an upper reflective layer and a lower reflective layer, the lower reflective layer being formed by the masking layer.

2. The image sensor device of claim 1, wherein the masking layer is made of at least one of the following materials: oxide, nitride, oxynitride, carbide, silicate, aluminate, polysilicon, and metal.

3. The image sensor device of claim 1, wherein a middle layer is provided between the image sensor area and the masking layer, the middle layer being made of at least one of the following materials: oxide, nitride, oxynitride, carbide, silicate, and aluminate.

4. The image sensor device of claim 1, wherein the optical resonator is a Fabry-Perot resonator.

5. An image sensor device comprising an optical pixel and an electronic circuit, wherein the optical pixel comprises:
a substrate;
an image sensor area formed in the substrate;
a masking layer formed above the image sensor area, wherein the masking layer is formed during a process for forming the electronic circuit; and
a light passage above the masking layer for increasing light sensing ability of the image sensor area; and
an optical resonator in the light passage above the masking layer, wherein the optical resonator includes:
a first metal-containing layer above the masking layer;
a first non-metal-containing layer above the first metal-containing layer;
a second metal-containing layer above the first non-metal-containing layer; and
a second non-metal-containing layer above the second metal-containing layer.

6. The image sensor device of claim 5, wherein the optical resonator further includes:
a third non-metal-containing layer between the masking layer and the first metal-containing layer.

7. The image sensor device of claim 5, wherein each metal-containing layer is made of at least one of the following materials: gold, silver, titanium, tantalum, copper, aluminum, gold carbide, silver carbide, titanium carbide, tantalum carbide, copper carbide, aluminum carbide, gold oxide, silver oxide, titanium oxide, tantalum oxide, copper oxide, aluminum oxide, gold nitride, silver nitride, titanium nitride, tantalum nitride, copper nitride, and aluminum nitride.

8. The image sensor device of claim 5, wherein each non-metal-containing layer is made of at least one of the following materials: oxide, nitride, oxynitride, and carbide.

* * * * *